United States Patent
Xie (10) Patent No.: US 10,600,979 B2
(45) Date of Patent: Mar. 24, 2020

(54) QUANTUM DOT DISPLAY DEVICE AND MANUFACTURE METHOD THEREOF

(71) Applicant: Shenzhen China Star Optoelectronics Semiconductor Display Technology Co., Ltd., Shenzhen (CN)

(72) Inventor: Huafei Xie, Shenzhen (CN)

(73) Assignee: Shenzhen China Star Optoelectronics Semiconductor Display Technology Co., Ltd., Shenzhen, GD (CN)

( * ) Notice: Subject to any disclaimer, the term of this patent is extended or adjusted under 35 U.S.C. 154(b) by 40 days.

(21) Appl. No.: 15/571,368

(22) PCT Filed: May 18, 2017

(86) PCT No.: PCT/CN2017/084851
§ 371 (c)(1),
(2) Date: Nov. 2, 2017

(87) PCT Pub. No.: WO2018/188155
PCT Pub. Date: Oct. 18, 2018

(65) Prior Publication Data
US 2018/0366673 A1    Dec. 20, 2018

(30) Foreign Application Priority Data
Apr. 14, 2017 (CN) .......................... 2017 1 0244634

(51) Int. Cl.
*H01L 51/50* (2006.01)
*H01L 51/00* (2006.01)
(Continued)

(52) U.S. Cl.
CPC ........ *H01L 51/502* (2013.01); *H01L 51/0097* (2013.01); *H01L 51/5056* (2013.01);
(Continued)

(58) Field of Classification Search
CPC ............... H01L 51/502; H01L 51/0097; H01L 51/5056; H01L 51/5072; H01L 51/5088;
(Continued)

(56) References Cited

U.S. PATENT DOCUMENTS

2008/0268282 A1* 10/2008 Spindler ................ C09K 11/06
428/690
2009/0212695 A1* 8/2009 Kim .................... H01L 51/5036
313/506

(Continued)

FOREIGN PATENT DOCUMENTS

| CN | 102694130 A | 9/2012 |
|---|---|---|
| CN | 104091892 A | 10/2014 |
| CN | 104885252 A | 9/2015 |

*Primary Examiner* — Dzung Tran
(74) *Attorney, Agent, or Firm* — Mark M. Friedman (57) ABSTRACT

Disclosed are a quantum dot display device and a manufacture method thereof. The quantum dot display device includes a flexible substrate, a first electrode layer, a second electrode layer, and a component combination layer. The material of the first electrode layer is a fullerene-graphene material or a carbon nanotube-graphene material. The material of the second electrode layer is the carbon nanotube-graphene material or the fullerene-graphene material. Or else, both of the material of the first electrode layer and the material of the second electrode layer are non-metal doped graphene. The device can reduce a use of metal material and thus avoid damage to the environment.

13 Claims, 4 Drawing Sheets

(51) Int. Cl.
*H01L 51/56* (2006.01)
*H01L 51/52* (2006.01)
*B82Y 30/00* (2011.01)
*B82Y 20/00* (2011.01)

(52) U.S. Cl.
CPC ...... *H01L 51/5072* (2013.01); *H01L 51/5088* (2013.01); *H01L 51/5206* (2013.01); *H01L 51/5215* (2013.01); *H01L 51/5221* (2013.01); *H01L 51/56* (2013.01); *B82Y 20/00* (2013.01); *B82Y 30/00* (2013.01); *H01L 51/5234* (2013.01); *H01L 2251/5338* (2013.01)

(58) Field of Classification Search
CPC . H01L 51/5206; H01L 51/5221; H01L 51/56; H01L 2251/5338; B82Y 30/00
USPC .......................................................... 257/40
See application file for complete search history.

(56) References Cited

U.S. PATENT DOCUMENTS

| | | | |
|---|---|---|---|
| 2012/0068154 A1* | 3/2012 | Hwang | H01L 51/502 257/13 |
| 2012/0241796 A1* | 9/2012 | Naito | H01L 27/3232 257/98 |
| 2014/0145145 A1* | 5/2014 | Lee | H01L 51/5012 257/13 |
| 2014/0183501 A1 | 7/2014 | Kim et al. | |
| 2014/0264269 A1* | 9/2014 | Choi | C09K 11/54 257/13 |
| 2014/0353613 A1* | 12/2014 | Cheon | H01L 51/0097 257/40 |
| 2016/0064681 A1* | 3/2016 | Lee | H01L 51/502 257/13 |

* cited by examiner

QUANTUM DOT DISPLAY DEVICE AND MANUFACTURE METHOD THEREOF

BACKGROUND

1. Field of the Disclosure

The present disclosure relates to display technology, and more particularly, to a quantum dot display device and a manufacture method thereof.

2. Description of the Related Art

Traditional display panels generally include TFT-LCDs (Thin Film Transistor Liquid Crystal Displays) and OLED (Organic Light Emitting Diode) Displays.

Generally speaking, the traditional display panels a large amount of and various types of metal, for example, indium used as transparent electrodes.

Because of the increasing shortage of indium, the rising cost, and the pollution to the environment caused by this type of metal, there is a need to develop a new display device to replace the traditional display panels that need to use a large amount of metal.

SUMMARY

The objective of the present disclosure is to provide a quantum dot display device and a manufacture method thereof, for reducing a use of metal material and the impact on the environment.

To solve above problems, the technical schemes provided by the present disclosure are described below.

A quantum dot display device includes a flexible substrate; a first electrode layer disposed on the flexible substrate; a component combination layer disposed on the first electrode layers; and a second electrode layer disposed on the component combination layer; wherein the first electrode layer is one of an anode and a cathode of the quantum dot display device and the second electrode layer is the other one of the anode and the cathode; wherein the component combination layer includes an electron transport layer, a carbon quantum dot light emitting layer, a hole transport layer, and a hole injection layer. wherein the material of the first electrode layer includes one of a fullerene-graphene material and a carbon nanotube-graphene material and the material of the second electrode layer includes the other one of the fullerene-graphene material and the carbon nanotube-graphene material; or both of the material of the first electrode layer and the material of the second electrode layer are non-metal doped graphene, the material of which is one of nitrogen-doped graphene, phosphorus-doped graphene, silicon-doped graphene, and boron-doped graphene; wherein the hole injection layer, the hole transport layer, the carbon quantum dot light emitting layer, and the electron transport layer are disposed on the first electrode layer according to a preset order, and the preset order is the hole injection layer, the hole transport layer, the carbon quantum dot light emitting layer, and the electron transport layer or the preset order is the electron transport layer, the carbon quantum dot light emitting layer, the hole transport layer, and the hole injection layer; wherein the carbon quantum dot light emitting layer includes carbon quantum dots or graphene quantum dots.

A quantum dot display device includes a flexible substrate; a first electrode layer disposed on the flexible substrate; a component combination layer disposed on the first electrode layers; and a second electrode layer disposed on the component combination layer; wherein the first electrode layer is one of an anode and a cathode of the quantum dot display device and the second electrode layer is the other one of the anode and the cathode; wherein the component combination layer includes an electron transport layer, a carbon quantum dot light emitting layer, a hole transport layer, and a hole injection layer; wherein the material of the first electrode layer includes one of a fullerene-graphene material and a carbon nanotube-graphene material and the material of the second electrode layer includes the other one of the fullerene-graphene material and the carbon nanotube-graphene material; or both of the material of the first electrode layer and the material of the second electrode layer are non-metal doped graphene.

In the quantum dot display device, the hole injection layer, the hole transport layer, the carbon quantum dot light emitting layer, and the electron transport layer are disposed on the first electrode layer according to a preset order, and the preset order is the hole injection layer, the hole transport layer, the carbon quantum dot light emitting layer, and the electron transport layer, or the preset order is the electron transport layer, the carbon quantum dot light emitting layer, the hole transport layer, and the hole injection layer.

In the quantum dot display device, the thickness of the first electrode layer or the second electrode layer made of the fullerene-graphene material ranges from 40 nm to 120 nm, the thickness of the second electrode layer or the first electrode layer made of the carbon nanotube-graphene material ranges from 20 nm to 100 nm, the thickness of the hole transport layer ranges from 20 nm to 60 nm, the thickness of the hole injection layer ranges from 20 nm to 60 nm, the thickness of the carbon quantum dot light emitting layer ranges from 10 nm to 30 nm, and the thickness of the electron transport layer ranges from 10 nm to 30 nm.

In the quantum dot display device, the thickness of the first electrode layer or the second electrode layer made of the fullerene-graphene material is substantially 80 nm, the thickness of the second electrode layer or the first electrode layer made of the carbon nanotube-graphene material is substantially 60 nm, the thickness of the hole transport layer is substantially 40 nm, the thickness of the hole injection layer is substantially 40 nm, the thickness of the carbon quantum dot light emitting layer is substantially 20 nm, and the thickness of the electron transport layer is substantially 20 nm.

In the quantum dot display device, the first electrode layer made of the fullerene-graphene material includes a first graphene layer and a first fullerene layer, the second electrode layer made of the carbon nanotube-graphene material includes a second graphene layer and a first carbon nanotube layer, the first graphene layer and the first fullerene layer are combined together, and the second graphene layer and the first carbon nanotube layer are combined together; or the first electrode layer made of the carbon nanotube-graphene material includes a third graphene layer and a second carbon nanotube layer, the second electrode layer made of the fullerene-graphene material includes a fourth graphene layer and a second fullerene layer, the third graphene layer and the second carbon nanotube layer are combined together, and the fourth graphene layer and the second fullerene layer are combined together.

In the quantum dot display device, the first electrode layer made of the fullerene-graphene material includes at least two first graphene layer and at least two first fullerene layer, the second electrode layer made of the carbon nanotube-graphene material includes at least two second graphene layer and at least two first carbon nanotube layer, the at least two first graphene layer and the at least two first fullerene layer are combined together, and the at least two second graphene layer and the at least two first carbon nanotube layer are combined together; or the first electrode layer made of the carbon nanotube-graphene material includes at least two third graphene layer and at least two second carbon nanotube layer, the second electrode layer made of the fullerene-graphene material includes at least two fourth graphene layer and at least two second fullerene layer, the at least two third graphene layer and the at least two second carbon nanotube layer are combined together, and the at least two fourth graphene layer and the at least two second fullerene layer are combined together.

In the quantum dot display device, the material of the non-metal doped graphene is one of nitrogen-doped graphene, phosphorus-doped graphene, silicon-doped graphene, and boron-doped graphene.

In the quantum dot display device, the carbon quantum dot light emitting layer includes carbon quantum dots or graphene quantum dots.

In the quantum dot display device, the electron gap of the first electrode layer is substantially 4.8 eV, the electron gap of the hole injection layer is substantially 5.0 eV, the electron gap of the hole transport layer ranges from 2.3 eV to 5.2 eV, the electron gap of the carbon quantum dot light emitting layer ranges from 3.9 eV to 5.5 eV, the electron gap of the electron transport layer ranges from 2.8 eV to 6.3 eV, and the electron gap of the second electrode layer is substantially 4.5 eV.

A method for manufacturing a quantum dot display device includes steps of (A) forming the flexible substrate on a glass substrate; (B) forming the first electrode layer on the flexible substrate, in which the first electrode layer is one of the anode and the cathode; (C) forming the component combination layer on the first electrode layer, the component combination layer including the electron transport layer, the carbon quantum dot light emitting layer, the hole transport layer, and the hole injection layer; (D) forming the second electrode layer on the component combination layer, in which the second electrode layer is the other one of the anode and the cathode; and (E) separating the flexible substrate from the glass substrate.

In the method for manufacturing the quantum dot display device, the step (A) includes (a1) dissolving a polyimide or polyethylene terephthalate in a first organic solvent to form a first solution having a predetermined weight percentage, the first organic solvent at least including dimethyl acetamide; (a2) coating the first solution uniformly on the glass substrate; and (a3) baking the first solution on the glass substrate to remove water and solvent in the first solution to form the flexible substrate attached to the glass substrate.

In the method for manufacturing the quantum dot display device, the step (a3) includes (a31) baking the glass substrate coated with the first solution at a temperature of 80° C. for 120 minutes to remove the solvent in the first solution; and (a32) after removal of the solvent, baking the solution for 60 minutes each at 100° C., 150° C., and 200° C. to remove the water to form the flexible substrate attached to the glass substrate and thus obtain a first component including the flexible substrate and the glass substrate.

In the method for manufacturing the quantum dot display device, the step (C) includes disposing the hole injection layer, the hole transport layer, the carbon quantum dot light emitting layer, and the electron transport layer on the first electrode layer according to a preset order, in which the preset order is the hole injection layer, the hole transport layer, the carbon quantum dot light emitting layer, and electron transport layer, or the preset order is the electron transport layer, the carbon quantum dot light emitting layer, the hole transport layer, and the hole injection layer.

In the method for manufacturing the quantum dot display device, the step (C) includes (c1) sequentially disposing the hole injection layer, the hole transport layer, the carbon quantum dot light emitting layer, and the electron transport layer on the first electrode layer; or (c2) sequentially disposing the electron transport layer, the carbon quantum dot light emitting layer, the hole transport layer, and the hole injection layer on the first electrode layer.

In the method for manufacturing the quantum dot display device, in a situation that the material of the first electrode layer includes a fullerene-graphene material and the material of the second electrode layer includes a carbon nanotube-graphene material, the step (B) includes (b1) forming a first graphene layer on the flexible substrate; and (b2) forming a first fullerene layer on the first graphene layer; the step (D) includes (d1) forming a second graphene layer on the component combination layer; and (d2) forming a first carbon nanotube layer on the second graphene layer; wherein in a situation that the material of the first electrode layer includes the carbon nanotube-graphene material and the material of the second electrode layer includes the fullerene-graphene material, the step (B) includes (b3) forming a third graphene layer on the flexible substrate; and (b4) forming a second carbon nanotube layer on the third graphene layer; the step (D) includes (d3) forming a fourth graphene layer on the component combination layer; and (d4) forming a second fullerene layer on the fourth graphene layer.

In the method for manufacturing the quantum dot display device, in the situation that the material of the first electrode layer includes the fullerene-graphene material and the material of the second electrode layer includes the carbon nanotube-graphene material, the step (b1) and the step (b2) are repeated in the step (B) to make the first electrode layer include at least two first graphene layer and at least two first fullerene layer, the at least two first graphene layer and the at least two first fullerene layer are combined together, and the step (d1) and the step (d2) are repeated in the step (D) to make the second electrode layer include at least two second graphene layer and at least two first carbon nanotube layer, and the at least two second graphene layer and the at least two first carbon nanotube layer are combined together; or wherein in the situation that the material of the first electrode layer includes the carbon nanotube-graphene material and the material of the second electrode layer includes the fullerene-graphene material, the step (b3) and the step (b4) are repeated in the step (B) to make the first electrode layer include at least two third graphene layer and at least two second carbon nanotube layer, the at least two third graphene layer and the at least two second carbon nanotube layer are combined together, and the step (d3) and the step (d4) are repeated in the step (D) to make the second electrode layer include at least two fourth graphene layer and at least two second fullerene layer, and the at least two fourth graphene layer and the at least two second fullerene layer are combined together.

As compared to the existing skills, the flexible substrate, the first electrode layer, the component combination layer, and the second electrode layer of the quantum dot display device of the present disclosure are made of organic materials without having metal materials. Therefore, a use of metal material is avoided and the impact on the environment is reduced.

To make above content of the present invention more easily understood, it will be described in details by using preferred embodiments in conjunction with the appending drawings.

DETAILED DESCRIPTION OF THE PREFERRED EMBODIMENTS

The term "embodiment" used in this description refers to an example, a demonstration, or an illustration. In addition, the two indefinite articles "a" and "an" used in this description and claims are generally understood as "one" or "more/a plurality of" unless a specific single form is pointed out or is determined in the context.

Figure 1:
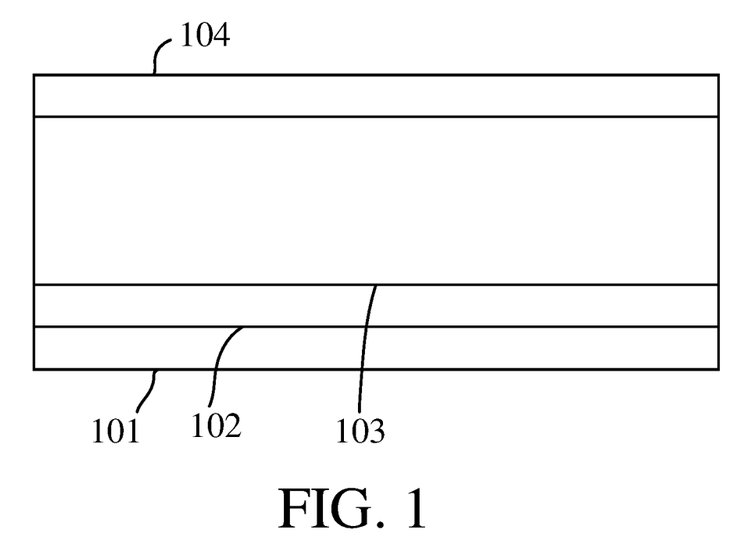
FIG. 1 is a schematic diagram showing a quantum dot display device in accordance with the present disclosure.
Figure 2:
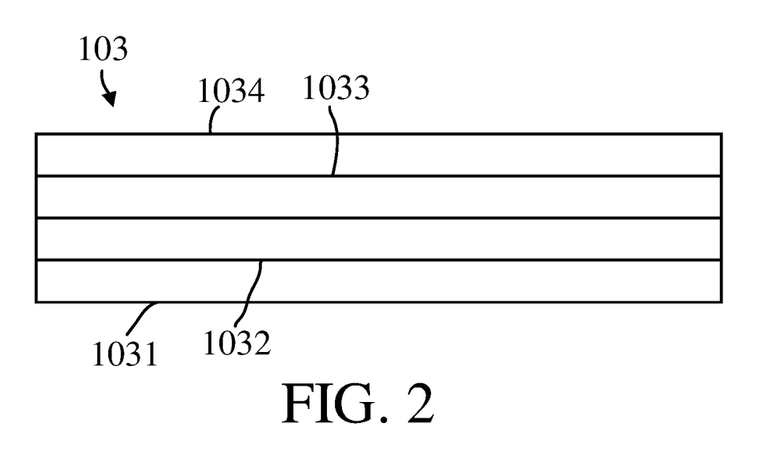
FIG. 2 is a schematic diagram showing a component combination layer of the quantum dot display device shown in FIG. 1.

Please refer to FIGS. 1 and 2. FIG. 1 is a schematic diagram showing a quantum dot display device in accordance with the present disclosure. FIG. 2 is a schematic diagram showing a component combination layer 103 of the quantum dot display device shown in FIG. 1.

The quantum dot display device of the present disclosure includes a flexible substrate 101, a first electrode layer 102, a component combination layer 103, and a second electrode layer 104.

The first electrode layer 102 is disposed on the flexible substrate 101. The component combination layer 103 is disposed on the first electrode layer 102. The second electrode layer 104 is disposed on the component combination layer 103.

The first electrode layer 102 is one of an anode and a cathode of the quantum dot display device and the second electrode layer 104 is the other one of the anode and the cathode.

The component combination layer 103 includes an electron transport layer 1034, a carbon quantum dot light emitting layer 1033, a hole transport layer 1032, and a hole injection layer 1031.

The material of the first electrode layer 102 includes one of a fullerene-graphene material and a carbon nanotube-graphene material and the material of the second electrode layer 104 includes the other one of the fullerene-graphene material and the carbon nanotube-graphene material. Alternatively, both of the material of the first electrode layer 102 and the material of the second electrode layer 104 are non-metal doped graphene.

The electron transport layer 1034, the carbon quantum dot light emitting layer 1033, the hole transport layer 1032, and the hole injection layer 1031 are made of organic materials.

In the quantum dot display device of the present disclosure, the hole injection layer 1031, the hole transport layer 1032, the carbon quantum dot light emitting layer 1033, and the electron transport layer 1034 are disposed on the first electrode layer 102 according to a preset order. The preset order is the hole injection layer 1031, the hole transport layer 1032, the carbon quantum dot light emitting layer 1033, and the electron transport layer 1034, or the preset order is the electron transport layer 1034, the carbon quantum dot light emitting layer 1033, the hole transport layer 1032, and the hole injection layer 1031.

In an embodiment, the hole injection layer 1031 is located on the first electrode layer 102, the hole transport layer 1032 is located on the hole injection layer 1031, the carbon quantum dot light emitting layer 1033 is located on the hole transport layer 1032, the electron transport layer 1034 is located on the carbon quantum dot light emitting layer 1033, and the second electrode layer 104 is located on the electron transport layer 1034.

Alternatively, the electron transport layer 1034 is located on the first electrode layer 102, the carbon quantum dot light emitting layer 1033 is located on the electron transport layer 1034, the hole transport layer 1032 is located on the carbon quantum dot light emitting layer 1033, the hole injection layer 1031 is located on the hole transport layer 1032, and the second electrode layer 104 is located on the hole injection layer 1031.

In the quantum dot display device of the present disclosure, the thickness of the first electrode layer 102 or the second electrode layer 104 made of the fullerene-graphene material ranges from 40 nm to 120 nm, the thickness of the second electrode layer 104 or the first electrode layer 102 made of the carbon nanotube-graphene material ranges from 20 nm to 100 nm, the thickness of the hole transport layer 1032 ranges from 20 nm to 60 nm, the thickness of the hole injection layer 1031 ranges from 20 nm to 60 nm, the thickness of the carbon quantum dot light emitting layer 1033 ranges from 10 nm to 30 nm, and the thickness of the electron transport layer 1034 ranges from 10 nm to 30 nm.

In an embodiment, the thickness of the first electrode layer 102 or the second electrode layer 104 made of the fullerene-graphene material is substantially 80 nm, the thickness of the second electrode layer 104 or the first electrode layer 102 made of the carbon nanotube-graphene material is substantially 60 nm, the thickness of the hole transport layer 1032 is substantially 40 nm, the thickness of the hole injection layer 1031 is substantially 40 nm, the thickness of the carbon quantum dot light emitting layer 1033 is substantially 20 nm, and the thickness of the electron transport layer 1034 is substantially 20 nm.

In the quantum dot display device of the present disclosure, the material of the flexible substrate 101 is a polyethylene terephthalate, polycarbonate, or polyimide, or a combination of two or more than two of them.

The non-metal doped graphene is one of nitrogen-doped graphene, phosphorus-doped graphene, silicon-doped graphene, and boron-doped graphene.

The material of the hole injection layer 1031 is one of PEDOT, PSS, a mixture of PEDOT and PSS, 2T-NATA, and m-MTDATA.

The material of the hole transport layer 1032 is one of TFB, PVK, CBP, NPB, Poly-TPD, TCTA, α-NPD, and MEH-PPV.

The carbon quantum dot light emitting layer 1033 includes carbon quantum dots or graphene quantum dots.

The material of the electron transport layer 1034 is one of TPBi, BBOT, BCP, Alq3 and BND.

PEDOT is Poly(3,4-ethylenedioxythiophene). PSS is polystyrene sulfonic acid. 2T-NATA is 4,4',4"-Tris[2-naphthyl(phenyl)amino]triphenylamine M-MTDATA is 4,4',4"-Tris[phenyl(m-tolyl)amino]triphenylamine. TFB is Poly[(9,9-dioctylfluorenyl-2,7-diyl)-co-(4,4'-(N-(4-sec-butylphenyl)diphenylamine)].

PVK is polyvinylcarbazole. CBP is 4,4'-Bis(N-carbazolyl)-1,1'-biphenyl. NPB is N,N'-Di(1-naphthyl)-N,N'-diphenyl-(1,1'-biphenyl)-4,4'-diamine. Poly-TPD is Poly[N,N'-bis(4-butylphenyl)-N,N'-bis(phenyl)-benzi.

In the quantum dot display device of the present disclosure, the first electrode layer 102 made of the fullerene-graphene material includes a first graphene layer and a first fullerene layer, the second electrode layer 104 made of the carbon nanotube-graphene material includes a second graphene layer and a first carbon nanotube layer, the first graphene layer and the first fullerene layer are combined together, and the second graphene layer and the first carbon nanotube layer are combined together. Alternatively, the first electrode layer 102 made of the carbon nanotube-graphene material includes a third graphene layer and a second carbon nanotube layer, the second electrode layer 104 made of the fullerene-graphene material includes a fourth graphene layer and a second fullerene layer, the third graphene layer and the second carbon nanotube layer are combined together, and the fourth graphene layer and the second fullerene layer are combined together.

As an improvement, the first electrode layer made of the fullerene-graphene material includes at least two first graphene layer and at least two first fullerene layer, the second electrode layer made of the carbon nanotube-graphene material includes at least two second graphene layer and at least two first carbon nanotube layer, the at least two first graphene layer and the at least two first fullerene layer are combined together, and the at least two second graphene layer and the at least two first carbon nanotube layer are combined together.

Alternatively, the first electrode layer made of the carbon nanotube-graphene material includes at least two third graphene layer and at least two second carbon nanotube layer, the second electrode layer made of the fullerene-graphene material includes at least two fourth graphene layer and at least two second fullerene layer, the at least two third graphene layer and the at least two second carbon nanotube layer are combined together, and the at least two fourth graphene layer and the at least two second fullerene layer are combined together.

In the context, the term "combined" or "combination" refers to "an overlap" or "a mix of".

In the quantum dot display device of the present disclosure, the electron gap of the first electrode layer 102 is substantially 4.8 eV, the electron gap of the hole injection layer 1031 is substantially 5.0 eV, the electron gap of the hole transport layer 1032 ranges from 2.3 eV to 5.2 eV, the electron gap of the carbon quantum dot light emitting layer 1033 ranges from 3.9 eV to 5.5 eV, the electron gap of the electron transport layer 1034 ranges from 2.8 eV to 6.3 eV, and the electron gap of the second electrode layer 104 is substantially 4.5 eV.

Figure 3:
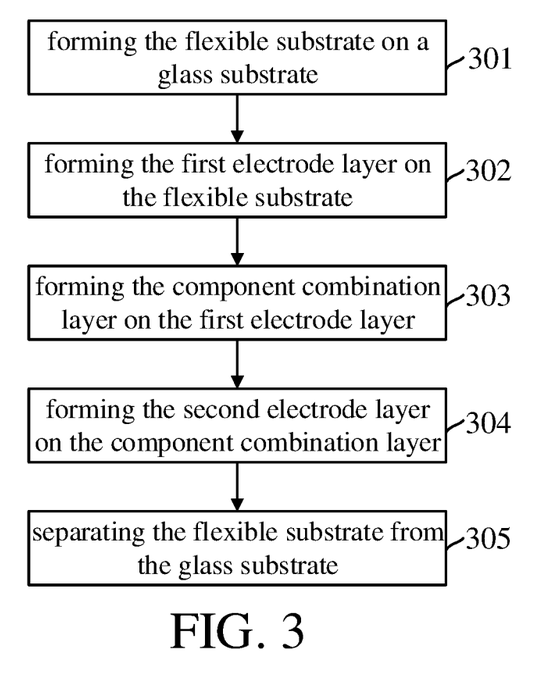
FIG. 3 is a flowchart of a method for manufacturing a quantum dot display device in accordance with the present disclosure.

Please refer to FIG. 3, which is a flowchart of a method for manufacturing a quantum dot display device in accordance with the present disclosure.

The quantum dot display device manufacturing method of the present disclosure includes the following steps.

(A) (Step 301) forming the flexible substrate 101 on a glass substrate.

(B) (Step 302) forming the first electrode layer 102 on the flexible substrate 101, in which the first electrode layer 102 is one of the anode and the cathode of the quantum dot display device.

(C) (Step 303) forming the component combination layer 103 on the first electrode layer 102, the component combination layer 103 including the electron transport layer 1034, the carbon quantum dot light emitting layer 1033, the hole transport layer 1032, and the hole injection layer 1031.

(D) (Step 304) forming the second electrode layer 104 on the component combination layer 103, in which the second electrode layer 104 is the other one of the anode and the cathode.

(E) (Step 305) separating the flexible substrate 101 from the glass substrate.

The material of the first electrode layer 102 includes one of a fullerene-graphene material and a carbon nanotube-graphene material and the material of the second electrode layer 104 includes the other one of the fullerene-graphene material and the carbon nanotube-graphene material.

Alternatively, both of the material of the first electrode layer 102 and the material of the second electrode layer 104 are non-metal doped graphene.

Figure 4:
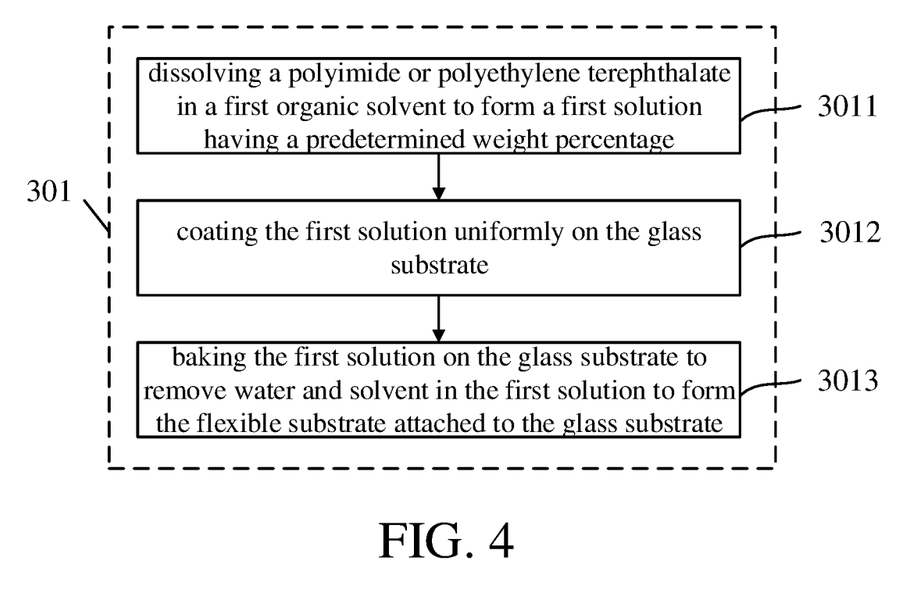
FIG. 4 is a flowchart of formation of a flexible substrate on a glass substrate as shown in FIG. 3.

Please refer to FIG. 4, which is a flowchart of formation of the flexible substrate 101 on the glass substrate as shown in FIG. 3.

In the quantum dot display device of the present disclosure, the step (A) includes the following steps.

(a1) (Step 3011) dissolving a polyimide or polyethylene terephthalate in a first organic solvent to form a first solution having a predetermined weight percentage, the first organic solvent at least including dimethyl acetamide.

(a2) (Step 3012) coating the first solution uniformly on the glass substrate.

(a3) (Step 3013) baking the first solution on the glass substrate to remove water and solvent in the first solution to form the flexible substrate 101 attached to the glass substrate.

In a situation that the polyimide is dissolved in the first organic solvent, the step (a3) further includes curing the polyimide in the first solution.

The predetermined weight percentage ranges from 1 wt % to 40 wt %. In an embodiment, the predetermined weight percentage is 10 wt %.

In the quantum dot display device of the present disclosure, the step (C) includes the following steps.

The hole injection layer 1031, the hole transport layer 1032, the carbon quantum dot light emitting layer 1033, and the electron transport layer 1034 are disposed on the first electrode layer 102 according to a preset order, in which the preset order is the hole injection layer 1031, the hole transport layer 1032, the carbon quantum dot light emitting layer 1033, and the electron transport layer 1034, or the preset order is the electron transport layer 1034, the carbon quantum dot light emitting layer 1033, the hole transport layer 1032, and the hole injection layer 1031.

In an embodiment, the step (C) includes the following steps.

(c1) sequentially disposing the hole injection layer 1031, the hole transport layer 1032, the carbon quantum dot light emitting layer 1033, and the electron transport layer 1034 on the first electrode layer 102; or (c2) sequentially disposing the electron transport layer 1034, the carbon quantum dot light emitting layer 1033, the hole transport layer 1032, and the hole injection layer 1031 on the first electrode layer 102.

Figure 5:
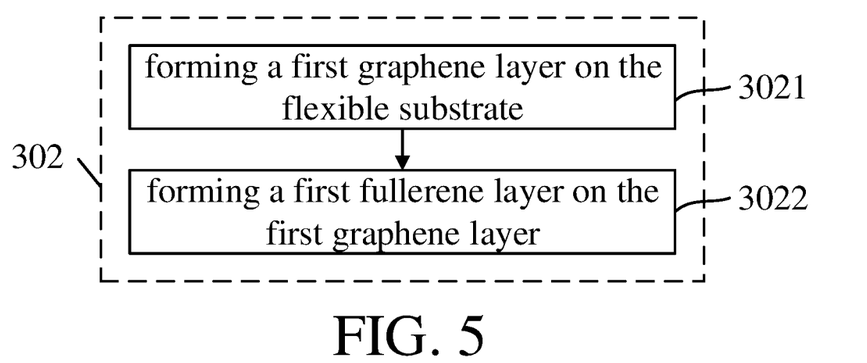
FIG. 5 is a flowchart of formation of a first electrode layer on a flexible substrate as shown in FIG. 3, in a situation that the material of the first electrode layer is a fullerene-graphene material.
Figure 6:
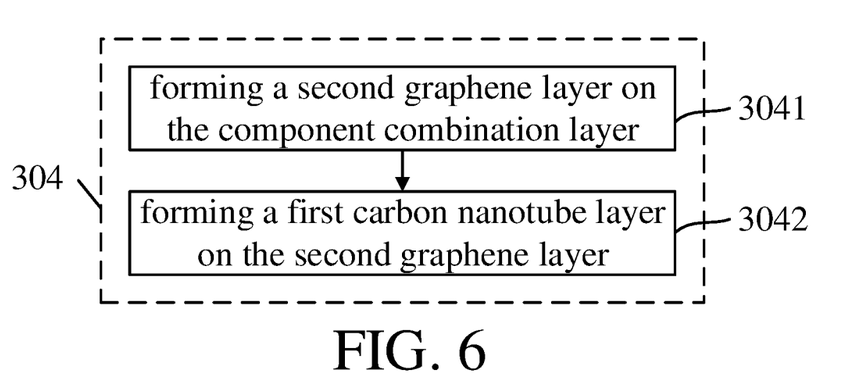
FIG. 6 is a flowchart of formation of a second electrode layer on a component combination layer as shown in FIG. 3, in a situation that the material of the second electrode layer is a carbon nanotube-graphene material.

Please refer to FIGS. 5 and 6. FIG. 5 is a flowchart of formation of the first electrode layer 102 on the flexible substrate 101 as shown in FIG. 3, in a situation that the material of the first electrode layer 102 is a fullerene-graphene material. FIG. 6 is a flowchart of formation of the second electrode layer 104 on the component combination layer 103 as shown in FIG. 3, in a situation that the material of the second electrode layer 104 is a carbon nanotube-graphene material.

In the quantum dot display device of the present disclosure, in a situation that the material of the first electrode layer includes a fullerene-graphene material and the material of the second electrode layer includes a carbon nanotube-graphene material, the step (B) includes the following steps.

(b1) (Step 3021) forming a first graphene layer on the flexible substrate 101.

(b2) (Step 3022) forming a first fullerene layer on the first graphene layer.

The step (D) includes the following steps.

(d1) (Step 3041) forming a second graphene layer on the component combination layer 103.

(d2) (Step 3042) forming a first carbon nanotube layer on the second graphene layer.

As an improvement, in the situation that the material of the first electrode layer includes the fullerene-graphene material and the material of the second electrode layer includes the carbon nanotube-graphene material, the step (b1) and the step (b2) are repeated in the step (B) to make the first electrode layer include at least two first graphene layer and at least two first fullerene layer, the at least two first graphene layer and the at least two first fullerene layer are combined together, and the step (d1) and the step (d2) are repeated in the step (D) to make the second electrode layer include at least two second graphene layer and at least two first carbon nanotube layer, and the at least two second graphene layer and the at least two first carbon nanotube layer are combined together.

Figure 7:
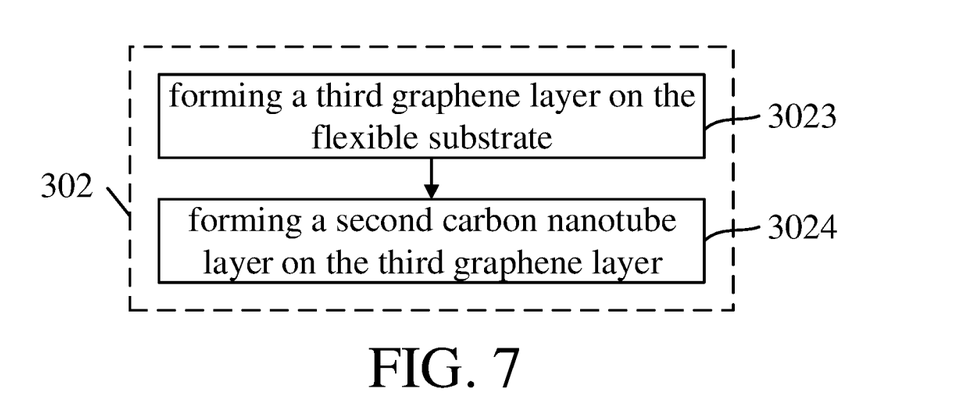
FIG. 7 is a flowchart of formation of the a first electrode layer on a flexible substrate as shown in FIG. 3, in a situation that the material of the first electrode layer is a carbon nanotube-graphene material.
Figure 8:
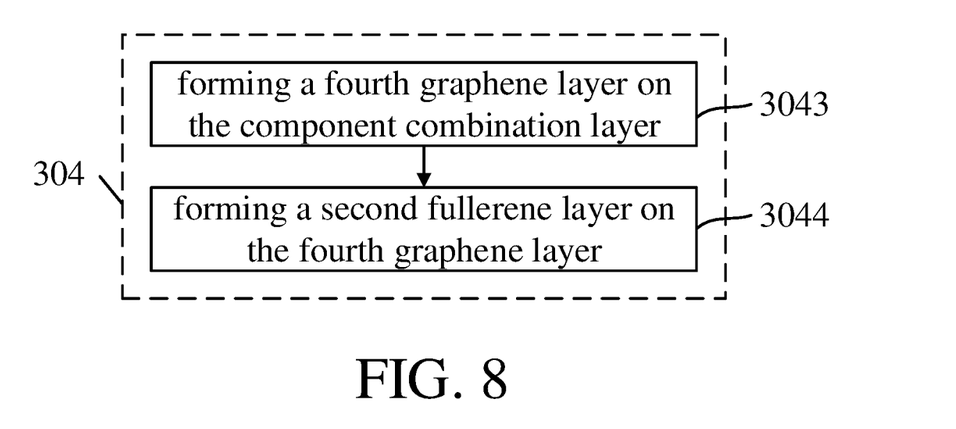
FIG. 8 is a flowchart of formation of a second electrode layer on a component combination layer as shown in FIG. 3, in a situation that the material of the second electrode layer is a fullerene-graphene material.

Please refer to FIGS. 7 and 8. FIG. 7 is a flowchart of formation of the first electrode layer 102 on the flexible substrate 101 as shown in FIG. 3, in a situation that the material of the first electrode layer 102 is a carbon nanotube-graphene material. FIG. 8 is a flowchart of formation of the second electrode layer 104 on the component combination layer 103 as shown in FIG. 3, in a situation that the material of the second electrode layer 104 is a fullerene-graphene material.

In the quantum dot display device of the present disclosure, in a situation that the material of the first electrode layer includes a carbon nanotube-graphene material and the material of the second electrode layer includes a fullerene-graphene material, the step (B) includes the following steps.

(b3) (Step 3023) forming a third graphene layer on the flexible substrate 101.

(b4) (Step 3024) forming a second carbon nanotube layer on the third graphene layer.

The step (D) includes the following steps.

(d3) (Step 3043) forming a fourth graphene layer on the component combination layer 103.

(d4) (Step 3044) forming a second fullerene layer on the fourth graphene layer.

As an improvement, in the situation that the material of the first electrode layer 102 includes the carbon nanotube-graphene material and the material of the second electrode layer 104 includes the fullerene-graphene material, the step (b3) and the step (b4) are repeated in the step (B) to make the first electrode layer include at least two third graphene layer and at least two second carbon nanotube layer, the at least two third graphene layer and the at least two second carbon nanotube layer are combined together, and the step (d3) and the step (d4) are repeated in the step (D) to make the second electrode layer 104 include at least two fourth graphene layer and at least two second fullerene layer, and the at least two fourth graphene layer and the at least two second fullerene layer are combined together.

The step (a3) includes the following steps.

(a31) baking the glass substrate coated with the first solution at a temperature of 80° C. for 120 minutes to remove the solvent in the first solution.

(a32) after removal of the solvent, baking the solution for 60 minutes each at 100° C., 150° C., and 200° C. to remove the water to form the flexible substrate 101 attached to the glass substrate and thus obtain a first component including the flexible substrate 101 and the glass substrate.

The step (b1) includes the following steps.

(b11) sandwiching a first copper foil between a first glass plate and a second glass plate, the first copper foil having a first graphene disposed thereon. The first graphene is disposed on a surface of the first copper foil. The first glass plate contacts the first graphene and the second glass plate contacts the first copper foil.

(b12) flattening the first graphene using the first glass plate and the second glass plate. In an embodiment, the first copper foil or a combination of the first glass plate and the second glass plate slides to make the first graphene flattened to form a first graphene layer.

(b13) removing the first glass plate.

(b14) placing the glass substrate having the flexible substrate 101 attached thereto (i.e., the first component) on the first copper foil having the first graphene layer disposed thereon. The flexible substrate 101 contacts the first graphene.

(b15) removing the second glass plate.

(b16) dropping an etching solution containing copper on the first copper foil to utilize the etching solution containing copper to etch the first copper foil.

(b17) using deionized water to wash a second component including the first graphene layer, the flexible substrate 101, and the glass substrate to remove the etching solution resided on the second component.

(b18) backing the second component. In an embodiment, the second component is baked for 120 minutes at 100° C.

The step (b2) includes the following steps.

(b21) dissolving the first fullerene in a second organic solvent to form a second solution. The second organic solvent can be a toluene solution, for example. The second solution is 5 millimoles per liter.

(b22) coating the second solution on the second component. In an embodiment, rotate the second component at a speed of 1000 rotations per minute, drop the second solution on the rotating second component, and keep the second component rotating for at least 30 seconds.

(b23) backing the solvent of the second solution deployed on the second component to form a first fullerene layer and obtain a third component including the first fullerene layer, the first graphene layer, the flexible substrate 101, and the glass substrate. In an embodiment, the second solution deployed on the second component is baked at a temperature of 200° C. for 120 minutes to form the third component.

A first electrode layer 102 having a structure of a plurality of fullerene layers and a plurality of graphene layers can be obtained as long as repeating the step (b22) and the step (b23). In the context, the term "a plurality of layers" refers to at least two layers. At least two layers of fullerene and at least two layers of graphene are combined together.

That is, the first electrode layer is a multiple layer structure of first graphene-first fullerene-second graphene-second fullerene- . . . -nth graphene-nth fullerene.

The step (d1) includes the following steps.

(d11) sandwiching a second copper foil between a third glass plate and a fourth glass plate, the second copper foil having a second graphene disposed thereon. The second graphene is disposed on a surface of the second copper foil. The third glass plate contacts the second graphene and the fourth glass plate contacts the second copper foil.

(d12) flattening the second graphene using the third glass plate and the fourth glass plate. In an embodiment, the second copper foil or a combination of the third glass plate and the fourth glass plate slides to make the second graphene flattened to form a second graphene layer.

(d13) removing the third glass plate.

(d14) placing the component combination layer 103 and the third component on the second copper foil having the second graphene layer disposed thereon. The component combination layer 103 contacts the third graphene.

(d15) removing the fourth glass plate.

(d16) dropping an etching solution containing copper on the second copper foil to utilize the etching solution containing copper to etch the second copper foil.

(d17) using deionized water to wash a fourth component including the second graphene layer, the component combination layer 103, the first electrode layer 102, the flexible substrate 101, and the glass substrate to remove the etching solution resided on the fourth component.

(d18) backing the fourth component. In an embodiment, the fourth component is baked for 120 minutes at 100° C.

The step (d2) includes the following steps.

(d21) coating a third solution on the fourth component, the third solution containing a first carbon nanotube distributed over a third organic solvent. The third organic solvent can be dimethylformamide, for example. In an embodiment, rotate the fourth component at a speed of 1000 rotations per minute, drop the third solution on the rotating fourth component, and keep the fourth component rotating for at least 30 seconds.

(d22) backing the solvent of the third solution deployed on the fourth component to form a first carbon nanotube layer and obtain a fifth component including the first carbon nanotube layer, the second graphene layer, the component combination layer 103, the first electrode layer 102, the flexible substrate 101, and the glass substrate. In an embodiment, the third solution deployed on the second graphene layer is baked at a temperature of 200° C. for 120 minutes to form the fifth component.

The step (b3) includes the following steps.

(b31) sandwiching a third copper foil between a fifth glass plate and a sixth glass plate, the third copper foil having a third graphene disposed thereon. The third graphene is disposed on a surface of the third copper foil. The fifth glass plate contacts the third graphene and the sixth glass plate contacts the third copper foil.

(b32) flattening the third graphene using the fifth glass plate and the sixth glass plate. In an embodiment, the third copper foil or a combination of the fifth glass plate and the sixth glass plate slides to make the third graphene flattened to form a third graphene layer.

(b33) removing the fifth glass plate.

(b34) placing the glass substrate having the flexible substrate 101 attached thereto (i.e., the first component) on the third copper foil having the third graphene layer disposed thereon. The flexible substrate 101 contacts the third graphene.

(b35) removing the sixth glass plate.

(b36) dropping an etching solution containing copper on the third copper foil to utilize the etching solution containing copper to etch the third copper foil.

(b37) using deionized water to wash a sixth component including the third graphene layer, the flexible substrate 101, and the glass substrate to remove the etching solution resided on the sixth component.

(b38) backing the sixth component. In an embodiment, the sixth component is baked for 120 minutes at 100° C.

The step (b4) includes the following steps.

(b41) coating a fourth solution on the sixth component, the fourth solution containing a second carbon nanotube distributed over a fourth organic solvent. The fourth organic solvent can be dimethylformamide, for example. In an embodiment, rotate the sixth component at a speed of 1000 rotations per minute, drop the fourth solution on the rotating sixth component, and keep the sixth component rotating for at least 30 seconds.

(b42) backing the solvent of the fourth solution deployed on the sixth component to form a second carbon nanotube layer and obtain a seventh component including the second carbon nanotube layer, the third graphene layer, the flexible substrate 101, and the glass substrate. In an embodiment, the fourth solution deployed on the third graphene layer is baked at a temperature of 200° C. for 120 minutes to form the seventh component.

The step (d3) includes the following steps.

(d31) sandwiching a fourth copper foil between a seventh glass plate and an eighth glass plate, the fourth copper foil having a fourth graphene disposed thereon. The fourth graphene is disposed on a surface of the fourth copper foil. The seventh glass plate contacts the fourth graphene and the eighth glass plate contacts the fourth copper foil.

(d32) flattening the fourth graphene using the seventh glass plate and the eighth glass plate. In an embodiment, the fourth copper foil or a combination of the seventh glass plate and the eighth glass plate slides to make the fourth graphene flattened to form a fourth graphene layer.

(d33) removing the seventh glass plate.

(d34) placing the component combination layer 103 and the seventh component on the fourth copper foil having the fourth graphene layer disposed thereon. The component combination layer 103 contacts the fourth graphene.

(d35) removing the eighth glass plate.

(d36) dropping an etching solution containing copper on the fourth copper foil to utilize the etching solution containing copper to etch the fourth copper foil.

(d37) using deionized water to wash an eighth component including the fourth graphene layer, the component combination layer 103, and the seventh component to remove the etching solution resided on the eighth component.

(d38) backing the eighth component. In an embodiment, the eighth component is baked for 120 minutes at 100° C.

The step (d4) includes the following steps.

(d41) dissolving the second fullerene in a fifth organic solvent to form a fifth solution. The fifth organic solvent can be a toluene solution, for example. The fifth solution is 5 millimoles per liter.

(d42) coating the fifth solution on the eighth component. In an embodiment, rotate the eighth component at a speed of 1000 rotations per minute, drop the fifth solution on the rotating eighth component, and keep the eighth component rotating for at least 30 seconds.

(d43) backing the solvent of the fifth solution deployed on the eighth component to form a second fullerene layer and obtain a ninth component including the second fullerene layer and the eighth component. In an embodiment, the fifth solution deployed on the eighth component is baked at a temperature of 200° C. for 120 minutes to form the ninth component.

A first electrode layer 102 having a structure of a plurality of fullerene layers and a plurality of graphene layers can be obtained as long as repeating the step (d42) and the step (d43). In the context, the term "a plurality of layers" refers to at least two layers. At least two layers of fullerene and at least two layers of graphene are combined together.

An individual layer of graphene can be obtained by peeling off the graphene layer from the flexible substrate 101 and/or the glass substrate.

The step (c1) includes the following steps.

(c11) coating a sixth solution of 10 mg/mL on the first electrode layer 102. In an embodiment, rotate a combination of the first electrode layer 102, the flexible substrate 101, and the glass substrate at a speed of 3000 rotations per minute, drop the sixth solution onto the first electrode layer 102, and keep the combination of the first electrode layer 102, the flexible substrate 101, and the glass substrate rotating for 60 seconds. The sixth solution is a mixed solution of PEDOT and PSS.

(c12) baking the sixth solution deployed on the first electrode layer 102 to form the hole injection layer 1031 and obtain a tenth component including the hole injection layer 1031, the first electrode layer 102, the flexible substrate 101, and the glass substrate.

(c13) coating a seventh solution of 10 mg/mL on the hole injection layer 1031. The seventh solution is a solution containing Poly-TPD.

(c14) baking the seventh solution deployed on the hole injection layer 1031 to form the hole transport layer 1032 and obtain a eleventh component including the hole transport layer 1032, the hole injection layer 1031, the first electrode layer 102, the flexible substrate 101, and the glass substrate.

(c15) coating an eighth solution on the hole transport layer 1032, the eighth solution containing quantum dots of 10 mg/mL dissolved in a sixth organic solvent. In an embodiment, rotate the eleventh component at a speed of 2000 rotations per minute, drop the eighth solution onto the hole transport layer 1032, and keep the eleventh component rotating for 20 seconds. The sixth organic solvent can be N-hexane, for example.

(c16) baking the eighth solution deployed on the hole transport layer 1032. In an embodiment, the eighth solution deployed on the hole transport layer 1032 is placed into a vacuum drying oven and is baked for 60 minutes at 80° C. to form the carbon quantum dot light emitting layer 1033 and obtain a twelfth component including the carbon quantum dot light emitting layer 1033 and the eleventh component.

(c17) utilizing an evaporator to evaporate 1,3,5-Tris(1-phenyl-1H-benzimidazol-2-yl)benzene on the carbon quantum dot light emitting layer 1033 to form the electron transport layer 1034 and obtain a thirteenth component including the electron transport layer 1034 and the twelfth component.

The step (c2) including the following steps.

(c21) utilizing an evaporator to evaporate 1,3,5-Tris(1-phenyl-1H-benzimidazol-2-yl)benzene on the first electrode layer 102 to form the electron transport layer 1034 and obtain a fourteenth component including the electron transport layer 1034, the first electrode layer 102, the flexible substrate 101, and the glass substrate.

(c22) coating an eighth solution on the electron transport layer 1034, the eighth solution containing quantum dots of 10 mg/mL dissolved in a sixth organic solvent. In an embodiment, rotate the fourteenth component at a speed of 2000 rotations per minute, drop the eighth solution onto the electron transport layer 1034, and keep the fourteenth component rotating for 20 seconds. The sixth organic solvent can be N-hexane, for example.

(c23) baking the eighth solution deployed on the electron transport layer 1034. In an embodiment, the eighth solution deployed on the electron transport layer 1034 is placed into a vacuum drying oven and is baked for 60 minutes at 80° C. to form the carbon quantum dot light emitting layer 1033 and obtain a fifteenth component including the carbon quantum dot light emitting layer 1033 and the fourteenth component.

(c24) coating a seventh solution of 10 mg/mL on the carbon quantum dot light emitting layer 1033. The seventh solution is a solution containing Poly-TPD.

(c25) baking the seventh solution deployed on the carbon quantum dot light emitting layer 1033 to form the hole transport layer 1032 and obtain a sixteenth component including the hole transport layer 1032 and the fifteenth component.

(c26) coating a sixth solution of 10 mg/mL on the hole transport layer 1032. In an embodiment, rotate the sixteenth component at a speed of 3000 rotations per minute, drop the sixth solution onto the hole transport layer 1032, and keep the sixteenth component rotating for 60 seconds. The sixth solution is a mixed solution of PEDOT and PSS.

(c27) baking the sixth solution deployed on the hole transport layer 1032 to form the hole injection layer 1031 and obtain a seventeenth component including the hole injection layer 1031 and the sixteenth component.

By afore-described technical schemes, the flexible substrate, the first electrode layer, the component combination layer, and the second electrode layer of the quantum dot display device of the present disclosure are made of organic materials without having metal materials. Therefore, a use of metal material is avoided and the impact on the environment is reduced.

Above all, while the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A quantum dot display device, comprising:
   a flexible substrate;
   a first electrode layer disposed on the flexible substrate;
   a component combination layer disposed on the first electrode layers; and
   a second electrode layer disposed on the component combination layer;
   wherein the first electrode layer is one of an anode and a cathode of the quantum dot display device and the second electrode layer is the other one of the anode and the cathode;
   wherein the component combination layer comprises an electron transport layer, a carbon quantum dot light emitting layer, a hole transport layer, and a hole injection layer;
   wherein the first electrode layer and the second electrode layer are made of organic materials without having metal materials, the material of the first electrode layer comprises one of a fullerene-graphene material and a carbon nanotube-graphene material and the material of the second electrode layer comprises the other one of the fullerene-graphene material and the carbon nanotube-graphene material;
   wherein the first electrode layer made of the fullerene-graphene material comprises a first graphene layer and a first fullerene layer, the second electrode layer made of the carbon nanotube-graphene material comprises a second graphene layer and a first carbon nanotube layer, the first graphene layer and the first fullerene layer are combined together, and the second graphene layer and the first carbon nanotube layer are combined together; or the first electrode layer made of the carbon nanotube-graphene material comprises a third graphene layer and a second carbon nanotube layer, the second electrode layer made of the fullerene-graphene material comprises a fourth graphene layer and a second fullerene layer, the third graphene layer and the second carbon nanotube layer are combined together, and the fourth graphene layer and the second fullerene layer are combined together;
   wherein the first electrode layer made of the fullerene-graphene material comprises at least two first graphene layers and at least two first fullerene layers, the second electrode layer made of the carbon nanotube-graphene material comprises at least two second graphene layers and at least two first carbon nanotube layers, the at least two first graphene layers and the at least two first fullerene layers are combined together, and the at least two second graphene layers and the at least two first carbon nanotube layer are combined togethers; or the first electrode layer made of the carbon nanotube-graphene material comprises at least two third graphene layers and at least two second carbon nanotube layers, the second electrode layer made of the fullerene-graphene material comprises at least two fourth graphene layers and at least two second fullerene layers, the at least two third graphene layers and the at least two second carbon nanotube layers are combined together, and the at least two fourth graphene layers and the at least two second fullerene layers are combined together;
   wherein the hole injection layer, the hole transport layer, the carbon quantum dot light emitting layer, and the electron transport layer are disposed on the first electrode layer according to a preset order, and the preset order is the hole injection layer, the hole transport layer, the carbon quantum dot light emitting layer, and the electron transport layer or the preset order is the electron transport layer, the carbon quantum dot light emitting layer, the hole transport layer, and the hole injection layer;
   wherein the carbon quantum dot light emitting layer comprises carbon quantum dots or graphene quantum dots.

2. The device according to claim 1, wherein the thickness of the first electrode layer or the second electrode layer made of the fullerene-graphene material ranges from 40 nm to 120 nm, the thickness of the second electrode layer or the first electrode layer made of the carbon nanotube-graphene material ranges from 20 nm to 100 nm, the thickness of the hole transport layer ranges from 20 nm to 60 nm, the thickness of the hole injection layer ranges from 20 nm to 60 nm, the thickness of the carbon quantum dot light emitting layer ranges from 10 nm to 30 nm, and the thickness of the electron transport layer ranges from 10 nm to 30 nm.

3. A quantum dot display device, comprising:
   a flexible substrate;
   a first electrode layer disposed on the flexible substrate;
   a component combination layer disposed on the first electrode layers; and
   a second electrode layer disposed on the component combination layer;
   wherein the first electrode layer is one of an anode and a cathode of the quantum dot display device and the second electrode layer is the other one of the anode and the cathode;
   wherein the component combination layer comprises an electron transport layer, a carbon quantum dot light emitting layer, a hole transport layer, and a hole injection layer;
   wherein the first electrode layer and the second electrode layer are made of organic materials without having metal materials, the material of the first electrode layer comprises one of a fullerene-graphene material and a carbon nanotube-graphene material and the material of the second electrode layer comprises the other one of the fullerene-graphene material and the carbon nanotube-graphene material;
   wherein the first electrode layer made of the fullerene-graphene material comprises a first graphene layer and a first fullerene layer, the second electrode layer made of the carbon nanotube-graphene material comprises a second graphene layer and a first carbon nanotube layer, the first graphene layer and the first fullerene layer are combined together, and the second graphene layer and the first carbon nanotube layer are combined together; or the first electrode layer made of the carbon nanotube-graphene material comprises a third graphene layer and a second carbon nanotube layer, the second electrode layer made of the fullerene-graphene material comprises a fourth graphene layer and a second fullerene layer, the third graphene layer and the second carbon nanotube layer are combined together, and the fourth graphene layer and the second fullerene layer are combined together;
   wherein the first electrode layer made of the fullerene-graphene material comprises at least two first graphene layers and at least two first fullerene layers, the second electrode layer made of the carbon nanotube-graphene material comprises at least two second graphene layers and at least two first carbon nanotube layers, the at least two first graphene layers and the at least two first fullerene layers are combined together, and the at least two second graphene layers and the at least two first carbon nanotube layer are combined togethers; or the first electrode layer made of the carbon nanotube-graphene material comprises at least two third graphene layers and at least two second carbon nanotube layers, the second electrode layer made of the fullerene-graphene material comprises at least two fourth graphene layers and at least two second fullerene layers, the at least two third graphene layers and the at least two second carbon nanotube layers are combined together, and the at least two fourth graphene layers and the at least two second fullerene layers are combined together.

4. The device according to claim 3, wherein the hole injection layer, the hole transport layer, the carbon quantum dot light emitting layer, and the electron transport layer are disposed on the first electrode layer according to a preset order, and the preset order is the hole injection layer, the hole transport layer, the carbon quantum dot light emitting layer, and the electron transport layer, or the preset order is the electron transport layer, the carbon quantum dot light emitting layer, the hole transport layer, and the hole injection layer.

5. The device according to claim 3, wherein the thickness of the first electrode layer or the second electrode layer made of the fullerene-graphene material ranges from 40 nm to 120 nm, the thickness of the second electrode layer or the first electrode layer made of the carbon nanotube-graphene material ranges from 20 nm to 100 nm, the thickness of the hole transport layer ranges from 20 nm to 60 nm, the thickness of the hole injection layer ranges from 20 nm to 60 nm, the thickness of the carbon quantum dot light emitting layer ranges from 10 nm to 30 nm, and the thickness of the electron transport layer ranges from 10 nm to 30 nm.

6. The device according to claim 5, wherein the thickness of the first electrode layer or the second electrode layer made of the fullerene-graphene material is substantially 80 nm, the thickness of the second electrode layer or the first electrode layer made of the carbon nanotube-graphene material is substantially 60 nm, the thickness of the hole transport layer is substantially 40 nm, the thickness of the hole injection layer is substantially 40 nm, the thickness of the carbon quantum dot light emitting layer is substantially 20 nm, and the thickness of the electron transport layer is substantially 20 nm.

7. The device according to claim 3, wherein the carbon quantum dot light emitting layer comprises carbon quantum dots or graphene quantum dots.

8. The device according to claim 3, wherein the electron gap of the first electrode layer is substantially 4.8 eV, the electron gap of the hole injection layer is substantially 5.0 eV, the electron gap of the hole transport layer ranges from 2.3 eV to 5.2 eV, the electron gap of the carbon quantum dot light emitting layer ranges from 3.9 eV to 5.5 eV, the electron gap of the electron transport layer ranges from 2.8 eV to 6.3 eV, and the electron gap of the second electrode layer is substantially 4.5 eV.

9. A manufacture method based on the quantum dot display device according to claim 3, comprising steps of:
(A) forming the flexible substrate on a glass substrate;
(B) forming the first electrode layer on the flexible substrate, in which the first electrode layer is one of the anode and the cathode;
(C) forming the component combination layer on the first electrode layer, the component combination layer comprising the electron transport layer, the carbon quantum dot light emitting layer, the hole transport layer, and the hole injection layer;
(D) forming the second electrode layer on the component combination layer, in which the second electrode layer is the other one of the anode and the cathode; and
(E) separating the flexible substrate from the glass substrate,
wherein the first electrode layer and the second electrode layer are made of organic materials without having metal materials;
wherein in a situation that the material of the first electrode layer comprises a fullerene-graphene material and the material of the second electrode layer comprises a carbon nanotube-graphene material, the step (B) comprises:
(b1) forming a first graphene layer on the flexible substrate; and
(b2) forming a first fullerene layer on the first graphene layer;
the step (D) comprises:
(d1) forming a second graphene layer on the component combination layer; and
(d2) forming a first carbon nanotube layer on the second graphene layer;
wherein in a situation that the material of the first electrode layer comprises the carbon nanotube-graphene material and the material of the second electrode layer comprises the fullerene-graphene material, the step (B) comprises:
(b3) forming a third graphene layer on the flexible substrate; and
(b4) forming a second carbon nanotube layer on the third graphene layer;
the step (D) comprises:
(d3) forming a fourth graphene layer on the component combination layer; and
(d4) forming a second fullerene layer on the fourth graphene layer;
wherein in the situation that the material of the first electrode layer comprises the fullerene-graphene material and the material of the second electrode layer comprises the carbon nanotube-graphene material, the step (b1) and the step (b2) are repeated in the step (B) to make the first electrode layer comprise at least two first graphene layers and at least two first fullerene layers, the at least two first graphene layers and the at least two first fullerene layers are combined together, and the step (d1) and the step (d2) are repeated in the step (D) to make the second electrode layer comprise at least two second graphene layers and at least two first carbon nanotube layers, and the at least two second graphene layers and the at least two first carbon nanotube layers are combined together; in the situation that the material of the first electrode layer comprises the carbon nanotube-graphene material and the material of the second electrode layer comprises the fullerene-graphene material, the step (b3) and the step (b4) are repeated in the step (B) to make the first electrode layer comprise at least two third graphene layers and at least two second carbon nanotube layers, the at least two third graphene layers and the at least two second carbon nanotube layers are combined together, and the step (d3) and the step (d4) are repeated in the step (D) to make the second electrode layer comprise at least two fourth graphene layers and at least two second fullerene layers, and the at least two fourth graphene layers and the at least two second fullerene layers are combined together.

10. The method according to claim 9, wherein the step (A) comprises:
- (a1L) dissolving a polyimide or polyethylene terephthalate in a first organic solvent to form a first solution having a predetermined weight percentage, the first organic solvent at least comprising dimethyl acetamide;
- (a2) coating the first solution uniformly on the glass substrate; and
- (a3) baking the first solution on the glass substrate to remove water and solvent in the first solution to form the flexible substrate attached to the glass substrate.

11. The method according to claim 10, wherein the step (a3) comprises:
- (a31) baking the glass substrate coated with the first solution at a temperature of 80° C. for 120 minutes to remove the solvent in the first solution; and
- (a32) after removal of the solvent, baking the solution for 60 minutes each at 100° C., 150° C., and 200° C. to remove the water to form the flexible substrate attached to the glass substrate and thus obtain a first component including the flexible substrate and the glass substrate.

12. The method according to claim 9, wherein the step (C) comprises:
- disposing the hole injection layer, the hole transport layer, the carbon quantum dot light emitting layer, and the electron transport layer on the first electrode layer according to a preset order, in which the preset order is the hole injection layer, the hole transport layer, the carbon quantum dot light emitting layer, and the electron transport layer, or the preset order is the electron transport layer, the carbon quantum dot light emitting layer, the hole transport layer, and the hole injection layer.

13. The method according to claim 12, wherein the step (C) comprises:
- (c1) sequentially disposing the hole injection layer, the hole transport layer, the carbon quantum dot light emitting layer, and the electron transport layer on the first electrode layer; or
- (c2) sequentially disposing the electron transport layer, the carbon quantum dot light emitting layer, the hole transport layer, and the hole injection layer on the first electrode layer.

* * * * *